(12) United States Patent
Hadar et al.

(10) Patent No.: US 8,274,172 B2
(45) Date of Patent: *Sep. 25, 2012

(54) SYSTEMS AND METHOD FOR LIMITING MAXIMUM VOLTAGE IN SOLAR PHOTOVOLTAIC POWER GENERATION SYSTEMS

(75) Inventors: Ron Hadar, Cupertino, CA (US);
Shmuel Arditi, Los Gatos, CA (US);
Maxym Makhota, Campbell, CA (US)

(73) Assignee: Tigo Energy, Inc., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/357,331

(22) Filed: Jan. 24, 2012

(65) Prior Publication Data

US 2012/0119584 A1      May 17, 2012

Related U.S. Application Data

(63) Continuation of application No. 12/562,933, filed on Sep. 18, 2009, now Pat. No. 8,102,074.

(60) Provisional application No. 61/273,210, filed on Jul. 30, 2009.

(51) Int. Cl.
*H02J 1/00*       (2006.01)
(52) U.S. Cl. .......................................... 307/5
(58) Field of Classification Search ........................ 307/5
See application file for complete search history.

(56) References Cited

U.S. PATENT DOCUMENTS

| | | | |
|---|---|---|---|
| 3,696,286 A | 10/1972 | Ule | |
| 4,580,090 A | 4/1986 | Bailey et al. | |
| 4,604,567 A | 8/1986 | Chetty | |
| 4,873,480 A | 10/1989 | Lafferty | |
| 5,027,051 A | 6/1991 | Lafferty | |
| 5,235,266 A | 8/1993 | Schaffrin | |
| 5,268,832 A | 12/1993 | Kandatsu | |
| 5,327,071 A | 7/1994 | Frederick et al. | |
| 5,504,418 A | 4/1996 | Ashley | |
| 5,604,430 A | 2/1997 | Decker et al. | |
| 5,648,731 A | 7/1997 | Decker et al. | |
| 5,747,967 A | 5/1998 | Muljadi et al. | |
| 5,923,158 A | 7/1999 | Kurokami et al. | |
| 5,932,994 A | 8/1999 | Jo et al. | |
| 6,275,016 B1 | 8/2001 | Ivanov | |

(Continued)

FOREIGN PATENT DOCUMENTS

AU      2005262278      7/2005

(Continued)

OTHER PUBLICATIONS

Alonso, R. et al., "A New Distributed Converter Interface for PV Panels," 20th European Photovoltaic Solar Energy Conference, Barcelona, Spain, pp. 2288-2291, Jun. 6-10, 2005.

(Continued)

*Primary Examiner* — Robert L. Deberadinis
(74) *Attorney, Agent, or Firm* — Greenberg Traurig, LLP

(57) ABSTRACT

Apparatuses and methods are disclosed for regulating or limiting the voltage output from solar modules connected in series such that the voltage on a string bus connecting those solar modules does not exceed regulatory or safety limitations. This can be accomplished via a controller, local management units (for downconverting solar module voltage output), or a combination of the two.

20 Claims, 11 Drawing Sheets

U.S. PATENT DOCUMENTS

| | | |
|---|---|---|
| 6,448,489 B2 | 9/2002 | Kimura et al. |
| 6,650,031 B1 | 11/2003 | Goldack |
| 6,844,739 B2 | 1/2005 | Kasai et al. |
| 6,894,911 B2 | 5/2005 | Telefus et al. |
| 6,919,714 B2 | 7/2005 | Delepaut |
| 6,984,970 B2 | 1/2006 | Capel |
| 6,987,444 B2 | 1/2006 | Bub et al. |
| 7,061,214 B2 | 6/2006 | Mayega |
| 7,068,017 B2 | 6/2006 | Wilner et al. |
| 7,248,946 B2 | 7/2007 | Bashaw et al. |
| 7,256,566 B2 | 8/2007 | Bhavaraju et al. |
| 7,259,474 B2 | 8/2007 | Blanc |
| 7,276,886 B2 | 10/2007 | Kinder |
| 7,336,004 B2 | 2/2008 | Lai |
| 7,378,820 B2 | 5/2008 | Liu et al. |
| 7,394,237 B2 | 7/2008 | Chou et al. |
| 7,462,955 B2 | 12/2008 | McNamara |
| 7,518,266 B2 | 4/2009 | Eckroad |
| 7,518,346 B2 | 4/2009 | Prexl |
| 7,538,451 B2 | 5/2009 | Nomoto |
| 7,545,053 B2 | 6/2009 | Yoshikawa |
| 7,560,906 B2 | 7/2009 | Liu et al. |
| 7,595,616 B2 | 9/2009 | Prexl |
| 7,602,080 B1 | 10/2009 | Hadar et al. |
| 7,605,498 B2 | 10/2009 | Ledenev et al. |
| 7,719,140 B2 | 5/2010 | Ledenev et al. |
| 7,839,022 B2 | 11/2010 | Wolfs |
| 7,900,361 B2 | 3/2011 | Adest et al. |
| 8,093,757 B2 | 1/2012 | Wolfs |
| 8,102,074 B2 * | 1/2012 | Hadar et al. .............. 307/5 |
| 2005/0057214 A1 | 3/2005 | Matan |
| 2005/0057215 A1 | 3/2005 | Matan |
| 2005/0172995 A1 | 8/2005 | Rohrig et al. |
| 2006/0001406 A1 | 1/2006 | Matan |
| 2006/0174939 A1 | 8/2006 | Matan |
| 2006/0185727 A1 | 8/2006 | Matan |
| 2007/0019613 A1 | 1/2007 | Frezzolini |
| 2007/0273351 A1 | 11/2007 | Matan |
| 2008/0030305 A1 | 2/2008 | O'Connor |
| 2008/0036440 A1 | 2/2008 | Garmer |
| 2008/0097655 A1 | 4/2008 | Hadar et al. |
| 2008/0106241 A1 | 5/2008 | Deaver et al. |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0143188 A1 | 6/2008 | Adest et al. |
| 2008/0150366 A1 | 6/2008 | Adest et al. |
| 2008/0179949 A1 | 7/2008 | Besser et al. |
| 2008/0191560 A1 | 8/2008 | Besser et al. |
| 2008/0191675 A1 | 8/2008 | Besser et al. |
| 2008/0303503 A1 | 12/2008 | Wolfs |
| 2010/0127570 A1 | 5/2010 | Hadar et al. |
| 2010/0127571 A1 | 5/2010 | Hadar et al. |
| 2011/0025130 A1 | 2/2011 | Hadar et al. |
| 2011/0062784 A1 | 3/2011 | Wolfs |

FOREIGN PATENT DOCUMENTS

| | | |
|---|---|---|
| DE | 4232356 | 3/1994 |
| DE | 19961705 | 7/2001 |
| DE | 10136147 | 2/2003 |
| EP | 0178757 | 4/1986 |
| EP | 1388774 | 2/2004 |
| ES | 2249147 | 3/2006 |
| JP | 07016552 | 3/1995 |
| JP | 11046457 | 2/1999 |
| JP | 11103538 | 4/1999 |
| JP | 2000166097 | 4/2008 |
| WO | 03012569 | 2/2003 |
| WO | 2005069096 | 7/2005 |
| WO | 2005112551 | 12/2005 |
| WO | 2008097591 | 8/2008 |
| WO | 2008125915 | 10/2008 |
| WO | 2010062662 | 6/2010 |

OTHER PUBLICATIONS

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Basso, Tim, "IEEE Standard for Interrconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Enslin, Johan H.R., et al., "Integrated Photovoltaic Maximum Power Point Tracking Converter," IEEE Transactions on Industrial Electronices, vol. 44, No. 6, pp. 769-773, Dec. 1997.

European Patent Application No. 09829487.9, Extended Search Report, Apr. 21, 2011.

Gautam, Nalin K. et al., "An Efficient Algorithm to Simulate the Electrical Performance of Solar Photovoltaic Arrays," Energy, vol. 27, No. 4, pp. 347-361, 2002.

International Patent Application No. PCT/AU2005/001017, International Search Report and Written Opinion, Aug. 18, 2005.

International Patent Application No. PCT/US2009/047734, International Search Report & Written Opinion, May 4, 2010.

International Patent Application No. PCT/US2009/062536, International Search Report & Written Opinion, Jun. 17, 2010.

International Patent Application No. PCT/US2010/029915, International Search Report and Written Opinion, Oct. 21, 2010.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

Quaschning, V. et al., "Cost Effectiveness of Shadow Tolerant Photovoltaic Systems," Euronsun 96, pp. 819-824, Sep. 16, 1996.

Roman, Eduardo, et al., "Intelligent PV Module for Grid-Connectred PV Systems," IEEE Transactions on Industrial Electronics, vol. 53, No. 4, pp. 1066-1073, Aug. 2006.

Uriarte, S. et al., "Energy Integrated Management System for PV Applications," 20th European Photovoltaic Solar Energy Conference, Jun. 6, 2005.

Walker, G. R. et al., "Cascaded DC-DC Converter Connection of Photovoltaic Modules," 33rd IEEE Power Electronics Specialists Conference (PESC'02), vol. 1, pp. 24-29, 2002.

Walker, Geoffrey R. et al., "Cascaded DC-DC Converter Connection of Photovoltaic Modules," IEEE Transactions on Power Electronics, vol. 19, No. 4, pp. 1130-1139, Jul. 2004.

Wolfs, Peter, U.S. Appl. No. 13/316,388, filed Dec. 9, 2011.

* cited by examiner

SYSTEMS AND METHOD FOR LIMITING MAXIMUM VOLTAGE IN SOLAR PHOTOVOLTAIC POWER GENERATION SYSTEMS

RELATED APPLICATIONS

The present application is a continuation application of U.S. patent application Ser. No. 12/562,933, filed Sep. 18, 2009, now U.S. Pat. No. 8,102,074, and entitled "SYSTEMS AND METHOD FOR LIMITING MAXIMUM VOLTAGE IN SOLAR PHOTOVOLTAIC POWER GENERATION SYSTEMS," which claims the benefit of Provisional U.S. Patent Application Ser. No. 61/273,210, filed Jul. 30, 2009 and entitled "SYSTEM AND METHOD FOR LIMITING MAXIMUM VOLTAGE IN SOLAR PHOTOVOLTAIC POWER GENERATION SYSTEMS," the disclosures of which applications are incorporated herein by reference in their entirety.

FIELD OF THE TECHNOLOGY

At least some embodiments of the disclosure relate to photovoltaic systems in general, and more particularly but not limited to, improving photovoltaic energy generation.

BACKGROUND

The number of solar modules connected in series in a solar array, and thus the total output power of the system, is limited by safety regulations. For instance, in the United States, the voltage on any part of the power line connecting solar modules into a solar array should not exceed 600V. In Europe this limit is 1000V. Conventional solar modules may typically generate a current and voltage that depend primarily on the intensity and wavelengths of sunlight (e.g., twilight sees decreased photon intensity, mornings see a larger number of high-energy blue photons, and cold temperatures increase solar cell efficiency and thus voltage output, to name a few). As a result, solar modules may typically generate a varying amount of power. To prevent solar arrays from exceeding regulatory or other safety limits, solar modules may be designed to operate at voltages, and may be combined in limited numbers, that are well below regulator or safety limits. This buffer allows solar arrays to stay below regulatory or safety limits even when solar modules generate higher-than-average voltages. Thus, conventional solar arrays on average may typically generate less power (current and voltage) than regulatory or safety limits, and may be limited in the number of solar modules that can be connected in series with an inverter and/or combiner box (or string combiner).

SUMMARY OF THE DESCRIPTION

Systems and methods in accordance with the present invention are described herein. Some embodiments are summarized in this section.

In one of many embodiments of the present invention, apparatuses include an energy production system having a string bus and first and second solar modules. The first solar module may be connected to the string bus and may generate a first voltage. The second solar module may be connected to the string bus and may generate a second voltage. The energy production system may also include a controller. The controller may be configured to limit the first voltage provided to the string bus, or to limit the second voltage provided to the string bus.

In another embodiment, apparatuses include an energy production system having a string bus, a solar module, and a controller. The solar module may be connected to the string bus and may generate a voltage. The controller may be in communication with the solar module and the string bus. The controller may be configured to control the voltage provided to the string bus. This control may be based on a predicted future voltage.

In another embodiment, a method includes monitoring a first voltage and a second voltage. The first voltage may be monitored across a first string bus section that connects a first solar module to a second solar module. The second voltage may be monitored across a second string bus section that connects the second solar module to a voltage output. The method may further include limiting the voltage output by limiting at least one of a voltage of the first solar module and a voltage of the second solar module.

Other embodiments and features of the present invention will be apparent from the accompanying drawings and from the detailed description which follows.

BRIEF DESCRIPTION OF THE DRAWINGS

The embodiments are illustrated by way of example and not limitation in the FIGS. of the accompanying drawings in which like references indicate similar elements.

DETAILED DESCRIPTION

Figure 1A:
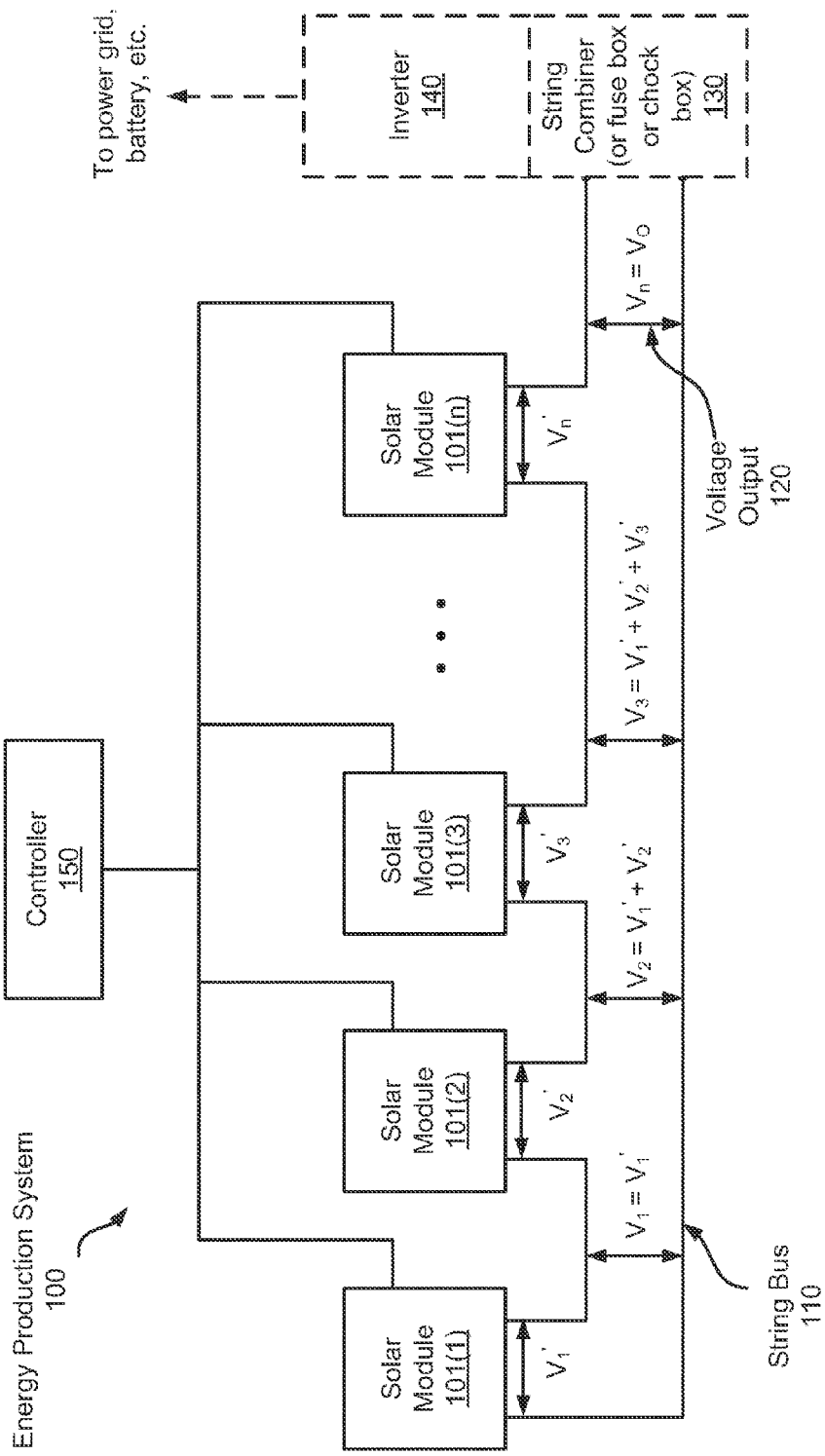
FIG. 1a illustrates an embodiment of an energy production system.

The following description and drawings are illustrative and are not to be construed as limiting. Numerous specific details are described to provide a thorough understanding. However, in certain instances, well known or conventional details are not described in order to avoid obscuring the description. References to one system, method, device, apparatus, component, etc., or to one embodiment, are not necessarily references to the same embodiment. Furthermore, such references mean at least one.

The number of solar modules (or panels) in a solar array may be limited by the maximum regulatory or safety voltage allowable on a string bus connecting those modules in series. It is desirable to operate a solar array at an open loop voltage (output of the entire array) as close to regulatory and safety limits as possible. Conventional systems have solar modules whose voltage output are typically difficult to control, and thus operate well below regulatory and safety limits in order to provide safety margins. The number of solar modules in an array is also limited for the same reason. The present disclosure overcomes these limitations by limiting (controlling or regulating) the voltage that each solar module provides to an array's output voltage. As such, solar modules can operate at higher voltages, with smaller safety buffers to regulatory and safety limits, and more solar modules can be connected in series in an array, since in times of excess energy generation module output can be reduced.

One embodiment of the present disclosure provides methods and systems to monitor the voltages along a string bus connecting a plurality of series-connected solar modules, and limit a portion of the voltage that each solar module provides to the string bus. In an embodiment, the systems and method herein disclosed determine what portion of a solar module's voltage to provide to the string bus based on a trend in the solar module's voltage. In this manner, a history of the solar module's generated voltage can be used to determine whether a predicted future voltage output from a solar module to the string bus will cause the voltage across any portion of the string bus to exceed a threshold voltage (e.g., regulatory limit associated with a particular solar module). In an embodiment, the systems and methods automatically limit the voltage output from solar modules when the voltage across any portion of the string bus exceeds another voltage threshold (e.g., a voltage just below of the regulatory or safety limit).

In an embodiment, the above-described operations can be controlled by local management units (LMU's) at each solar module (e.g., between each solar module and the string bus). The LMU's can be controlled via a central controller (or a controller). In another embodiment, LMU's at each solar module can control each solar module voltage output, while one of the LMU's acts as a central controller for all of the LMU's.

The above-described controls also allow control of the open loop voltage (VOC) by, for example, switching off some or all solar module connections to the string bus. For example, by using the LMU's of the system, one or more solar modules can be disconnected from the string bus if any portion of the string bus voltage approaches a regulatory or safety limit. As such, solar modules can operate at higher average voltages and more solar modules can be installed in a solar array (a solar array is an embodiment of an "energy production system").

FIG. 1a illustrates an embodiment of an energy production system. The energy production system 100 includes one or more solar modules 101(1), 101(2), 101(3), ..., 101(n) (n is any positive integer), a string bus 110, and a controller 150. For the purposes of this disclosure, a "solar module" means a device comprising one or more solar cells connected in series or parallel. Solar cells are configured to absorb and convert photons into electricity. While solar cells can be designed to operate with visible and near-visible wavelength photons, solar cells can also absorb and convert to electricity photons having other wavelengths. In an embodiment, each solar module 101(1), 101(2), 101(3), ..., 101(n) absorbs photons and generates electricity. This will be referred to as voltage generation. That voltage can be provided to the string bus 110. However, that voltage can also be limited (regulated, controlled, decreased, downconverted) and only a portion of the voltage generated by a solar module may be provided to the string bus 110. For instance, the first solar module 101(1) may generate a first voltage $V_1$ (e.g., 30V), but the voltage $V_1'$ provided to the string bus 110 may be only a portion of $V_1$ (e.g., 20V).

For the purposes of this disclosure, a "string bus" means a conductive medium (e.g., wire, cable, lead, to name a few) configured to carry energy from the solar modules 101(1), 101(2), 101(3), ..., 101(n) to a voltage output 120. The one or more solar modules 101(1), 101(2), 101(3), ..., 101(n) can be connected to the string bus 110 (also referred to as a string or serial bus string). In an embodiment, the solar modules 101(1), 101(2), 101(3), ..., 101(n) can be connected serially to the string bus 110. In an embodiment, the string bus 110 can carry signals. For instance, a signal can be modulated on the current or voltage traveling through the string bus 110 to or from the solar modules 101(1), 101(2), 101(3), ..., 101(n). Such signals can represent data such as voltages and currents at different points in the system or instructions/commands for limiting solar module voltage output to name a few.

Each solar module 101(1), 101(2), 101(3), ..., 101(n) can provide a voltage to the string bus 110. For example, the first solar module 102 can provide a first voltage $V_1'$ to the string bus 110; the second solar module 104 can provide a second voltage $V_2'$ to the string bus 110; the third solar module 106 can provide a third voltage $V_3'$ to the string bus 110, etc. The voltage on a segment (or portion) of the string bus 110 between any two solar modules 101(1), 101(2), 101(3), ..., 101(n) is equal to the sum of the voltage contributions from each solar module that came before that segment. For instance the voltage on the string bus 110 between the second solar module 101(2) and the third solar module 101(3) is $V_2$. This voltage $V_2$ is equal to the sum of the first voltage $V_1'$ and the second voltage $V_2'$. In other words, $V_2=V_1'+V_2'$. This can also be written as $V_2=V_1+V_2'$. An output voltage $V_O$ is thus the sum of the voltage contributions from all solar modules in the system 100 ($V_O=V_1'+V_2'+V_3'+ \ldots +V_n'$).

The voltage that each solar module 101(1), 101(2), 101(3), ..., 101(n) provides to the string bus 110 can be controlled (limited or regulated) by the controller 150. As a result, the controller 150 may be able to prevent a voltage on the string bus from exceeding a predefined limit. In an embodiment, the predefined limit can be a regulatory or safety limitation. In the illustrated embodiment, the controller 150 is connected to each solar module 101(1), 101(2), 101(3), ..., 101(n). In an embodiment, the controller 150 can monitor currents and voltages on the string bus 110 and currents and voltages provided to the string bus 110 by the solar modules 101(1), 101(2), 101(3), ..., 101(n). In an embodiment (not illustrated), the controller 150 can wirelessly communicate with the solar modules 101(1), 101(2), 101(3), ..., 101(n). For the purposes of this disclosure, a "controller" means a device that is an intelligent master to other subordinate devices. For instance, a solar module may be generating 30V, but the controller 150 may instruct the solar module to provide only 20V to the string bus 110. In this manner, the controller 150 can ensure that the voltage on any part of the string bus 110 does not exceed a threshold (or voltage threshold). In an embodiment, this threshold is related to a regulatory voltage limit (e.g., 600V in the United States and 1000V in Europe). In an embodiment, the threshold is slightly lower than the regulatory limit thus providing a margin of error relative to the regulatory limit or buffer. In an embodiment, this threshold is related to a safety voltage limit.

In an embodiment, the voltage provided to the string bus 110 by a solar module 101(1), 101(2), 101(3), ..., 101(n) may be limited by one or more switchable connections. The switchable connections may be coupled between each solar module 101(1), 101(2), 101(3), ..., 101(n) and the string bus 110.

A switchable connection may comprise a switch, a gate, a transistor, or any other device configured to limit the current or voltage passing between the solar modules 101(1), 101(2), 101(3), . . . , 101(n) and the string bus 110. The word "limit" should not be construed to mean a complete on or off state. In some embodiments, this may be true (e.g., a mechanical switch). However, in some embodiments, switches only decrease the current or voltage.

The voltage output 120 can be connected to any number of devices or other energy transporting mediums (e.g., power lines, other buses, to name a few). Optionally, the voltage output 120 can be connected to an inverter 140, or to a string combiner 130 and an inverter 140. The string combiner 130 may also be known as a fuse box or chock box. The inverter 140 can provide power to an electric grid, to a battery, or to some other energy-using device or system. In one embodiment, the controller 150 is part of the inverter 140 or the string combiner 130.

Figure 1B:
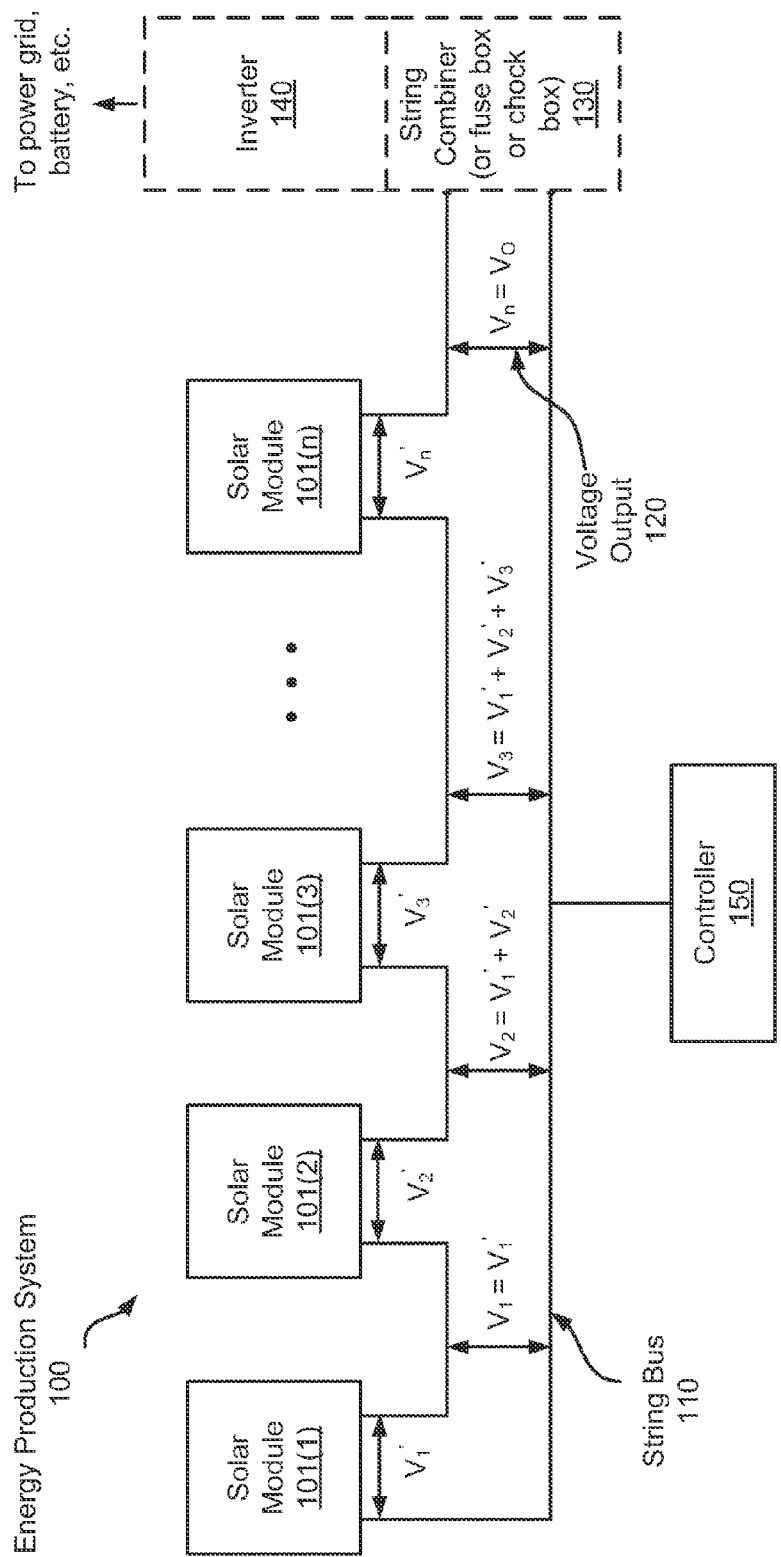
FIG. 1b illustrates another embodiment of an energy storage system

FIG. 1b illustrates another embodiment of an energy storage system. The illustrated embodiment of energy storage system includes a controller 150 connected directly to the string bus 110. The controller 150 can monitor voltages via the string bus 110. The controller 150 can also communicate instructions and/or data regarding the voltages to the solar modules 101(1), 101(2), 101(3), . . . , 101(n) via the string bus 110, via wireless connection, or via both. The controller 150 can also communicate instructions and/or data regarding the voltages to the LMU's (not illustrated) via the string bus 110.

Although the controller 150 connects to a bottom line of the string bus 110, it should be understood that such a configuration is non-limiting. For instance, the controller 150 can be connected to the string bus 110 in series or in parallel. The controller 150 can also communicate with the inverter 140 or the string combiner 130 via the string bus 110, wireless connections, or a combination of both.

While the controller 150 illustrated in FIGS. 1a and 1b is connected to the solar modules 101(1), 101(2), 101(3), . . . , 101(n), it will be seen in the following discussion of FIGS. 2-4 that other embodiments of the controller 150 are also possible.

Figure 2:
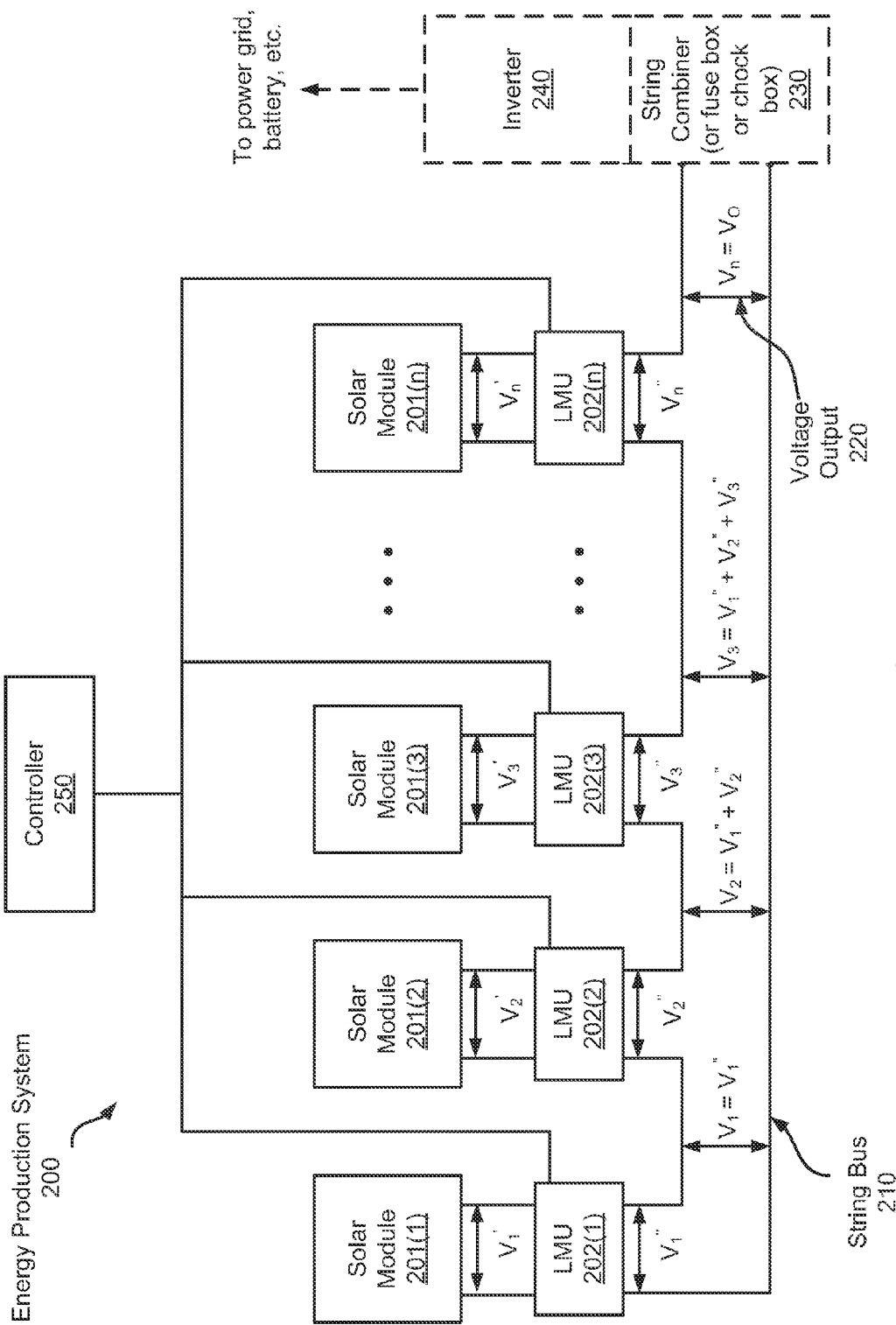
FIG. 2 illustrates an energy production system where the voltage provided to the string bus from each solar module is controlled by a local management unit.

FIG. 2 illustrates an energy production system where the voltage provided to the string bus from each solar module is controlled by a LMU. Similarly to FIG. 1a, the energy storage system 200 includes one or more solar modules 201(1), 201 (2), 201(3), . . . , 201(n) (n is any positive integer), a string bus 210, and a controller 250. The energy storage system 200 also includes LMU's 202(1), 202(2), 202(3), . . . , 202(n) coupled between the solar modules 201(1), 201(2), 201(3), . . . , 201(n) and the string bus 210. For the purposes of this disclosure, a "LMU" means a device configured to limit (or regulate or manage or control) the voltage that a solar module provides to a string bus. A LMU may be variously referred to as a solar module controller (or converter) or link module unit. In an embodiment, the LMU's 202(1), 202(2), 202(3), . . . , 202(n) can limit a portion of the voltages provided to the string bus 210 from each solar module 201(1), 201(2), 201(3), . . . , 201(n). For instance, the last solar module 201(n) may generate a voltage $V_n'$=50V. When this 50V is added to the string bus, the output voltage $V_O$ may exceed the threshold value (a regulatory or safety limit). Thus, instead of allowing all 50V to be provided to the string bus 250, the LMU 202(n) may limit a portion of the voltage provided to the string bus 210 to $V_n''$. As a result, the output voltage $V_O$ will remain below the threshold voltage. Thus, one sees that each LMU 202(1), 202(2), 202(3), . . . , 202(n) acts as a voltage converter capable of down converting each solar module voltage output.

In an embodiment, the LMU's 202(1), 202(2), 202(3), . . . , 202(n) limit the voltage that the solar modules 201(1), 201(2), 201(3), . . . , 201(n) provide to the string bus 210 via a switchable connection. For the purposes of this disclosure, a "switchable connection" is a connection between two conductors that can be opened and closed. In other words, a switchable connection is one in which current can be selectively allowed to pass or not. Switchable connections often comprise a switch such as a gate or transistor. In an embodiment, a switchable connection has two states, on and off. In an embodiment, the on state passes 100% of the current and voltage. In an embodiment, the on state passes slightly less than 100% of the current and/or voltage. In an embodiment, the off state passes 0% of the current and voltage. In an embodiment, the off state passes slightly greater than 0% of the current and/or voltage.

It should be understood that down conversion is not required. If there is no need to limit the output voltage from a solar module 201(1), 201(2), 201(3), . . . , 201(n), then the associated LMU 202(1), 202(2), 202(3), . . . , 202(n) need not limit the voltage output. In an embodiment, the LMU's 202 (1), 202(2), 202(3), . . . , 202(n) may be turned off when voltage limiting is not required.

In the illustrated embodiment, the controller 250 is connected to the LMU's 202(1), 202(2), 202(3), . . . , 202(n). In an embodiment, the controller 250 controls the LMU's 202 (1), 202(2), 202(3), . . . , 202(n). In an embodiment (not illustrated), the controller 250 communicates to the LMU's 02(1), 202(2), 202(3), . . . , 202(n) via wired connection, wirelessly (not illustrated), or both.

In an embodiment (not illustrated), the controller 250 can monitor the voltages $V_1', V_2', V_3', \ldots, V_n'$ provided to the LMU's 202(1), 202(2), 202(3), . . . , 202(n) from each solar module 201(1), 201(2), 201(3), . . . , 201(n). In an embodiment, the solar modules 201(1), 201(2), 201(3), . . . , 201(n) can monitor the voltages $V_1', V_2', V_3', \ldots, V_n'$ provided to the LMU's 202(1), 202(2), 202(3), . . . , 202(n) from each solar module 201(1), 201(2), 201(3), . . . , 201(n). The solar modules 201(1), 201(2), 201(3), . . . , 201(n) can communicate data regarding the voltages $V_1', V_2', V_3', \ldots, V_n'$ to the controller 250 via a direct wired or wireless connection or via the LMU's 202(1), 202(2), 202(3), . . . , 202(n). Alternatively, the LMU's 202(1), 202(2), 202(3), . . . , 202(n) can monitor the voltages $V_1', V_2', V_3', \ldots, V_n'$ and provide data regarding the voltages $V_1', V_2', V_3', \ldots, V_n'$ to the controller 250. The controller 250 or the LMU's 202(1), 202(2), 202(3), . . . , 202(n) can also monitor the voltage outputs $V_1'', V_2'', V_3'', \ldots, V_n''$ from the LMU's 202(1), 202(2), 202(3), . . . , 202(n) (the voltage provided to the string bus 210).

In an embodiment, another device, such as a current/voltage monitoring device, can monitor currents and voltages. For instance, the current/voltage monitoring device can monitor currents and voltages on the string bus, or currents and voltages generated by the solar modules. The current/voltage monitoring device can then communicate data representing the monitored currents and voltages to LMU's or the controller (depending on the embodiment).

In an embodiment, the controller 250 is configured to predict a voltage contribution to the string bus 210 for each solar module 201(1), 201(2), 201(3), . . . , 201(n). The controller 250 may be further configured to determine if the predicted voltage contribution for each solar module 201(1), 201(2), 201(3), . . . , 201(n) exceeds a predefined voltage limit associated with a solar module. In one embodiment, the predefined voltage limit may be a value unique to each solar module 201(1), 201(2), 201(3), . . . , 201(n). The controller 250 may be further configured to identify each solar module 201(1), 201(2), 201(3), . . . , 201(n) and the associated local management unit 202(1), 202(2), 202(3), . . . , 202(n) having a predicted voltage contribution exceeding the predefined voltage limit. The controller 250 may be further configured to instruct each identified local management unit to limit the voltage contribution.

In an embodiment, the controller 250 is configured to predict a voltage across a portion of the string bus 210 spanning between two solar modules or LMU's. The controller 250 may further be configured to determine if the predicted voltage exceeds a voltage limit threshold.

In an embodiment, a controlling local management unit is configured to predict a voltage contribution to the string bus 210 for each solar module 201(1), 201(2), 201(3), . . . , 201(n). The controlling local management unit may be further configured to determine if the predicted voltage contribution for each solar module 201(1), 201(2), 201(3), . . . , 201(n) exceeds a predefined voltage limit. The controlling local management unit may be further configured to identify each solar module 201(1), 201(2), 201(3), . . . , 201(n) and the associated LMU 202(1), 202(2), 202(3), . . . , 202(n) having a predicted voltage contribution exceeding the predefined voltage limit. The controlling LMU may be further configured to instruct each identified local management unit to limit the voltage contribution.

It should be understood that various methods and functions can be carried out by various components in the systems illustrated in FIGS. 1-7. For instance, either the controller, the solar modules, or the local management units can monitor currents and/or voltage provided to the string bus from the solar modules or can monitor currents and/or voltages on the string bus. The controller, the solar modules, the local management unit, or a controlling local management unit can analyze data regarding currents and/or voltages. From this analysis, the controller, the solar modules, the local management units, or the controlling local management unit can determine how to control voltages provided to the string bus so as to prevent voltages on the string bus from exceeding regulatory or safety limits.

Figure 3:
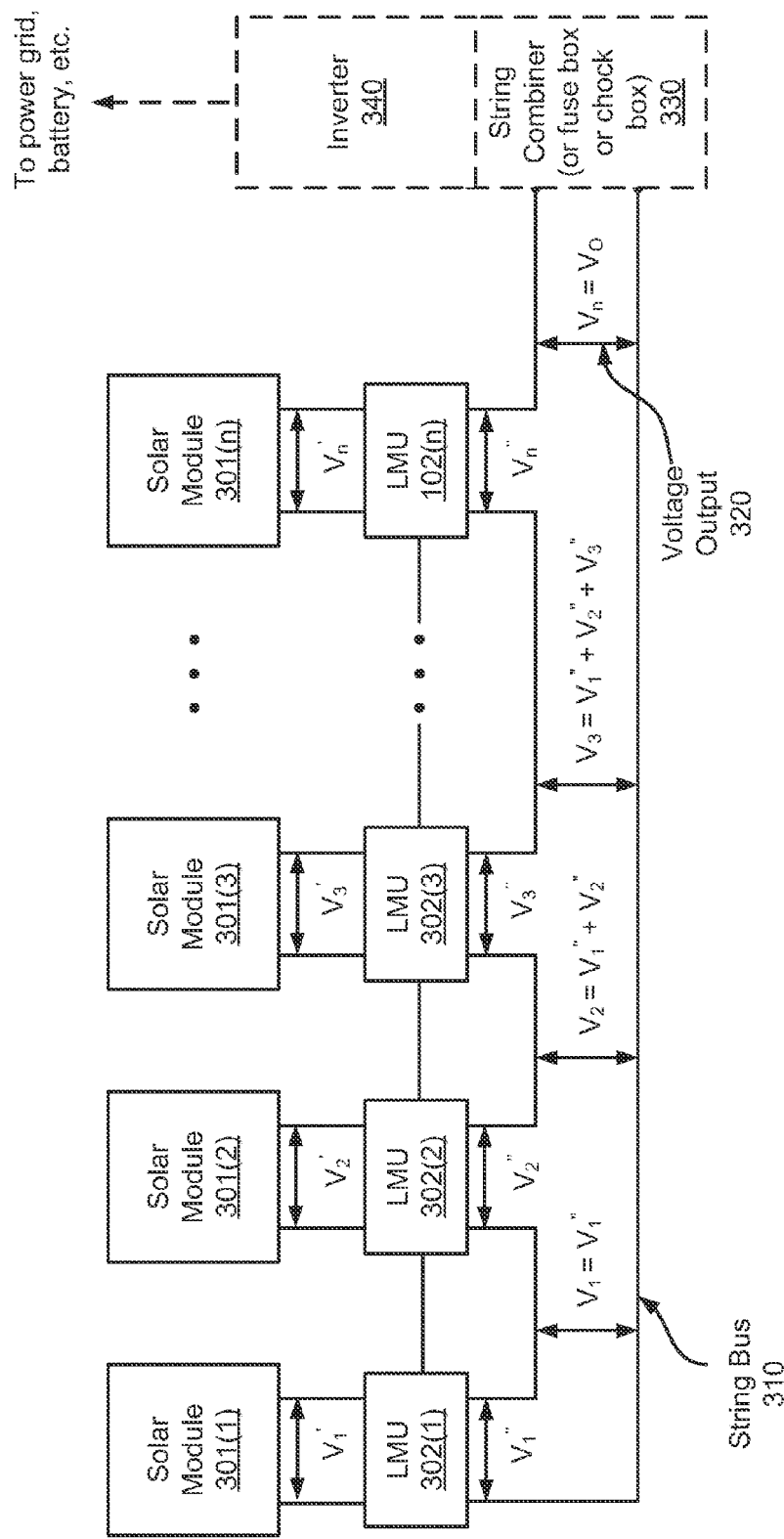
FIG. 3 illustrates an energy storage system where the controller comprises local management units.

FIG. 3 illustrates an energy storage system where the controller comprises LMU's. Similarly to FIG. 2, the energy storage system 300 includes one or more solar modules 301(1), 301(2), 301(3), . . . , 301(n) (n is any positive integer), a string bus 310, and LMU's 302(1), 302(2), 302(3), . . . , 302(n). However, the controller is not separate from the LMU's 302(1), 302(2), 302(3), . . . , 302(n), but rather comprises them. In the illustrated embodiment, the LMU's 302(1), 302(2), 302(3), . . . , 302(n) carry out functions that a controller might carry out including, but not limited to, monitoring voltages, determining which voltages provided to the string bus 310 should be limited, predicting future voltages, comparing voltages to voltage thresholds, and limiting the voltages provided to the string bus 310 by each solar module 301(1), 301(2), 301(3), . . . , 301(n). Again, either the solar modules 301(1), 301(2), 301(3), . . . , 301(n) or the LMU's 302(1), 302(2), 302(3), . . . , 302(n) can monitor voltages. In determining which voltages from solar modules 301(1), 301(2), 301(3), . . . , 301(n) should be limited, the LMU's 302(1), 302(2), 302(3), . . . , 302(n) may communicate with each other either via wired connection, wirelessly (not illustrated), or both.

In an embodiment, one of the LMU's 302(1), 302(2), 302(3), . . . , 302(n) can act as the controller. As such, the controlling LMU 302(1), 302(2), 302(3), . . . , 302(n) can determine the voltages that the other LMU's 302(1), 302(2), 302(3), . . . , 302(n) should provide to the string bus 310. The controlling LMU 302(1), 302(2), 302(3), . . . , 302(n) can also perform all analyses in determining which LMU's 302(1), 302(2), 302(3), . . . , 302(n) should limit voltages provided to the string bus 310. The controlling LMU can be selected using any suitable protocol. In one embodiment, the first LMU that announces its intent to take control of other LMU's can become the controlling LMU.

Alternatively, the LMU's 302(1), 302(2), 302(3), . . . , 302(n) can do this monitoring and analysis in accord or individually. For instance, one LMU can monitor the voltage output of the solar module that the LMU is connected to. One LMU can also monitor the voltages on the string bus 310. This same LMU can then determine how much voltage provided by the solar module should be provided to the string bus 310, and limit the voltage accordingly. Such operations can take place independent of the other LMU's 302(1), 302(2), 302(3), . . . , 302(n).

Figure 4:
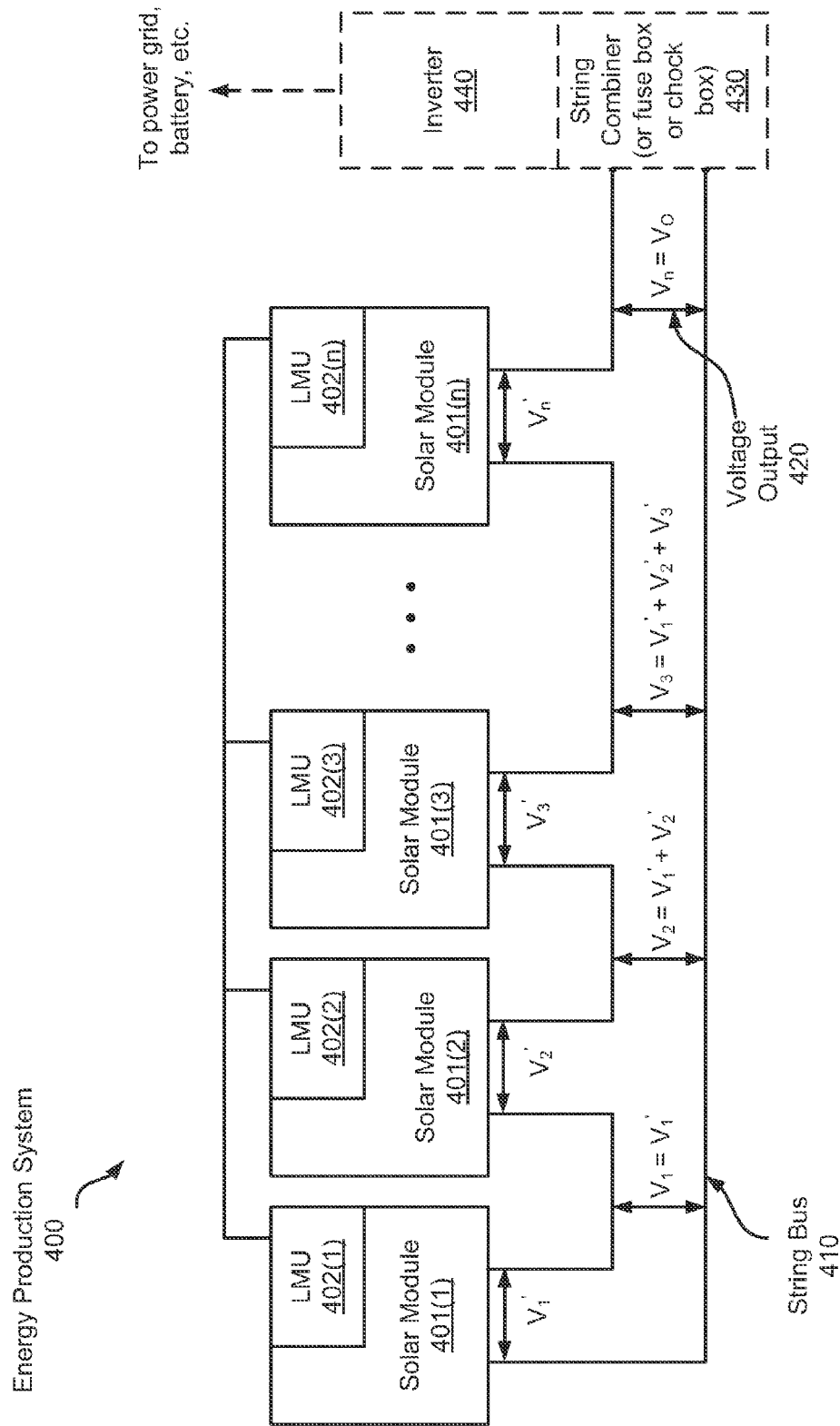
FIG. 4 illustrates an energy storage system where local management units reside on the solar modules.

FIG. 4 illustrates an energy storage system where LMU's reside on the solar modules. Similarly to FIG. 3, the energy storage system 400 includes one or more solar modules 401(1), 401(2), 401(3), . . . , 401(n) (n is any positive integer), a string bus 410, and LMU's 402(1), 402(2), 402(3), . . . , 402(n). The controller is again embodied by the set of LMU's 402(1), 402(2), 402(3), . . . , 402(n). However, in this embodiment, the LMU's 402(1), 402(2), 402(3), . . . , 402(n) are incorporated into the solar modules 401(1), 401(2), 401(3), . . . , 401(n). From the solar modules, 401(1), 401(2), 401(3), . . . , 401(n) the LMU's 402(1), 402(2), 402(3), . . . , 402(n) are able to limit the voltages $V_1'$, $V_2'$, $V_3'$, $V_n'$ provided to the string bus 410. Either the solar modules 401(1), 401(2), 401(3), . . . , 401(n) or the LMU's 402(1), 402(2), 402(3), . . . , 402(n) can monitor voltages. The LMU's 402(1), 402(2), 402(3), . . . , 402(n) can work together or independently. The LMU's 402(1), 402(2), 402(3), . . . , 402(n) can communicate with each other via wired connections, via wireless connection, or via both.

In each of the embodiments illustrated in FIGS. 1-4 it should be understood that communications between components can be performed at least via the following three methods alone or in combination: wired connection, wireless connection, or the string bus. Multiple signals can be communicated via a single connection (e.g., multiplexing).

Figure 5:
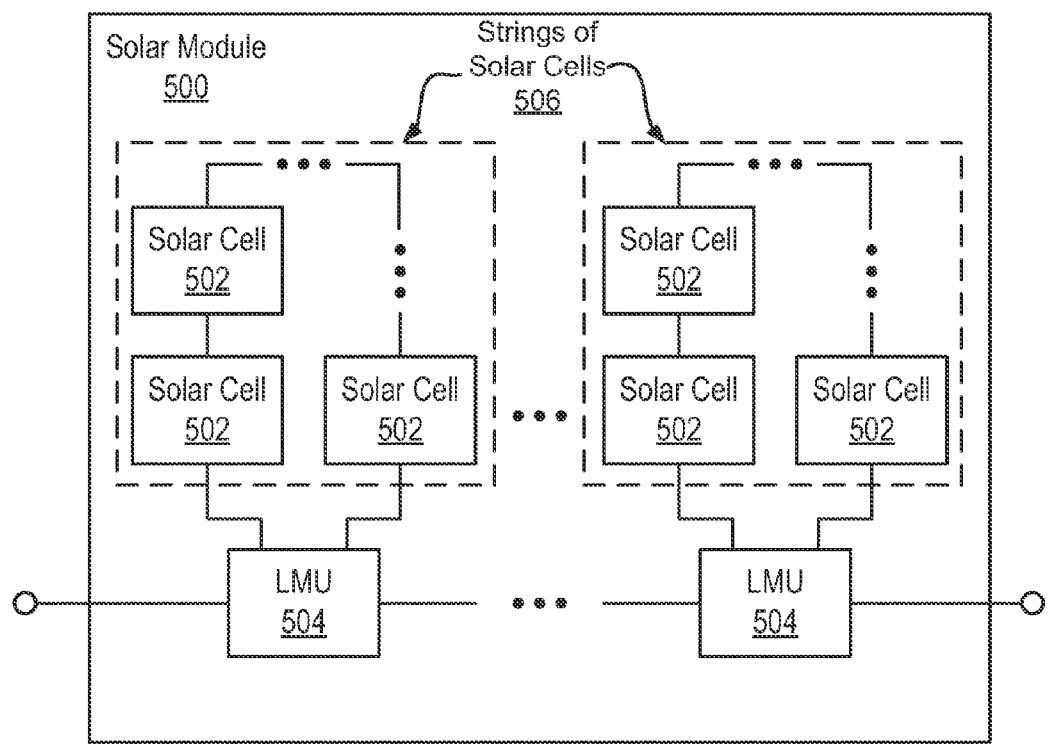
FIG. 5 illustrates a solar module having a plurality of solar cells controlled by one or more local management units.

FIG. 5 illustrates a solar module having a plurality of solar cells controlled by one or more LMU's. In one embodiment, the solar module 500 has one or more strings of solar cells 506. For example, in the illustrated embodiment, there are at least two strings of solar cells 506. In FIG. 5, a LMU 504 can control the voltage output of a group of cells 502. In an embodiment, a LMU 504 can control the voltage output of individual cells 502. A string of solar cells 506 may be connected in series, in parallel, or in a mesh configuration. The LMU 504 can control the voltage output of the string 506 or two or more LMU's 504 can be connected in series to form a string. The string can be connected to output connections for the solar module 500.

Figure 6:
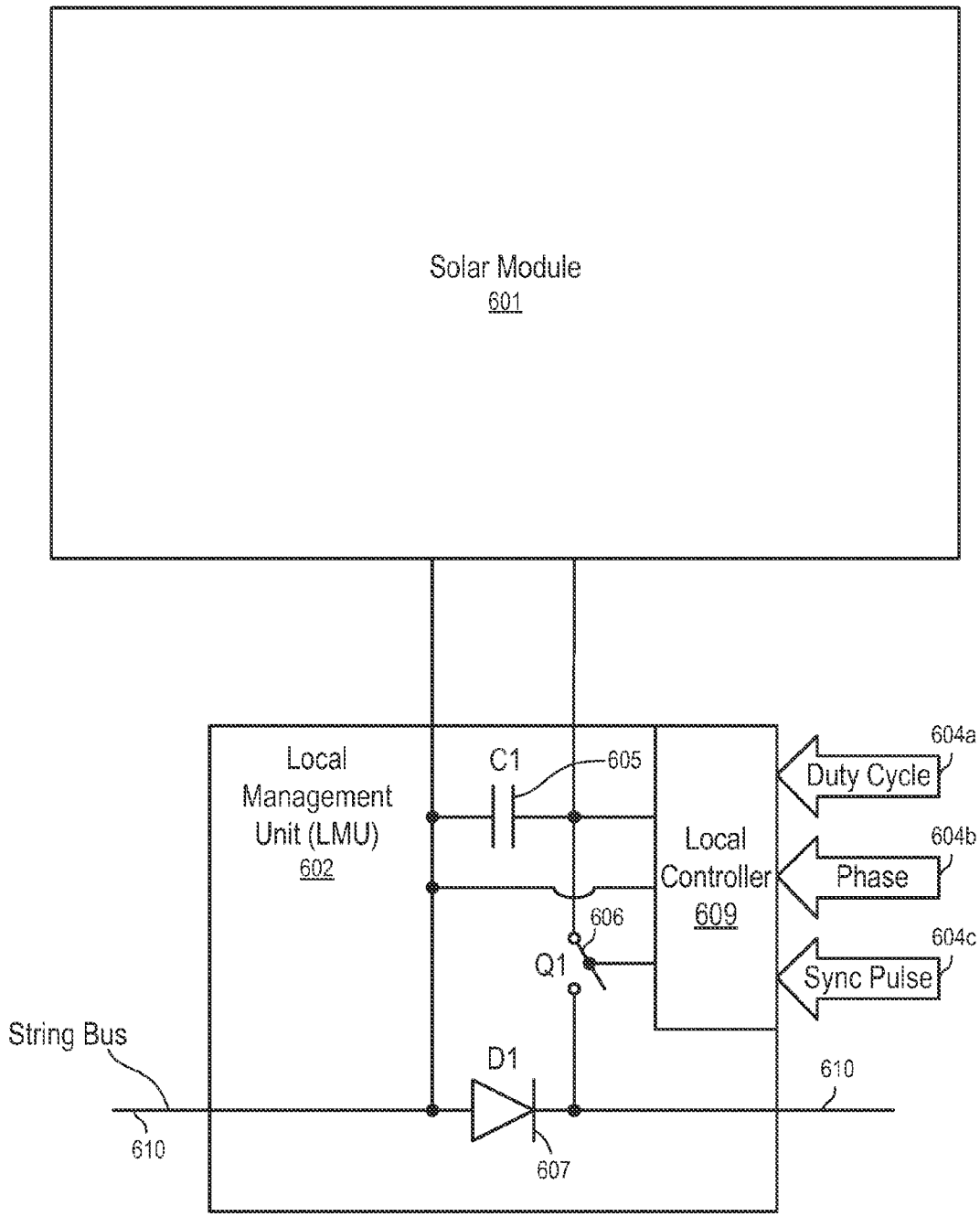
FIG. 6 illustrates a portion of an embodiment of an energy storage unit comprising a solar module, a local management unit, and a portion of a string bus.
Figure 7:
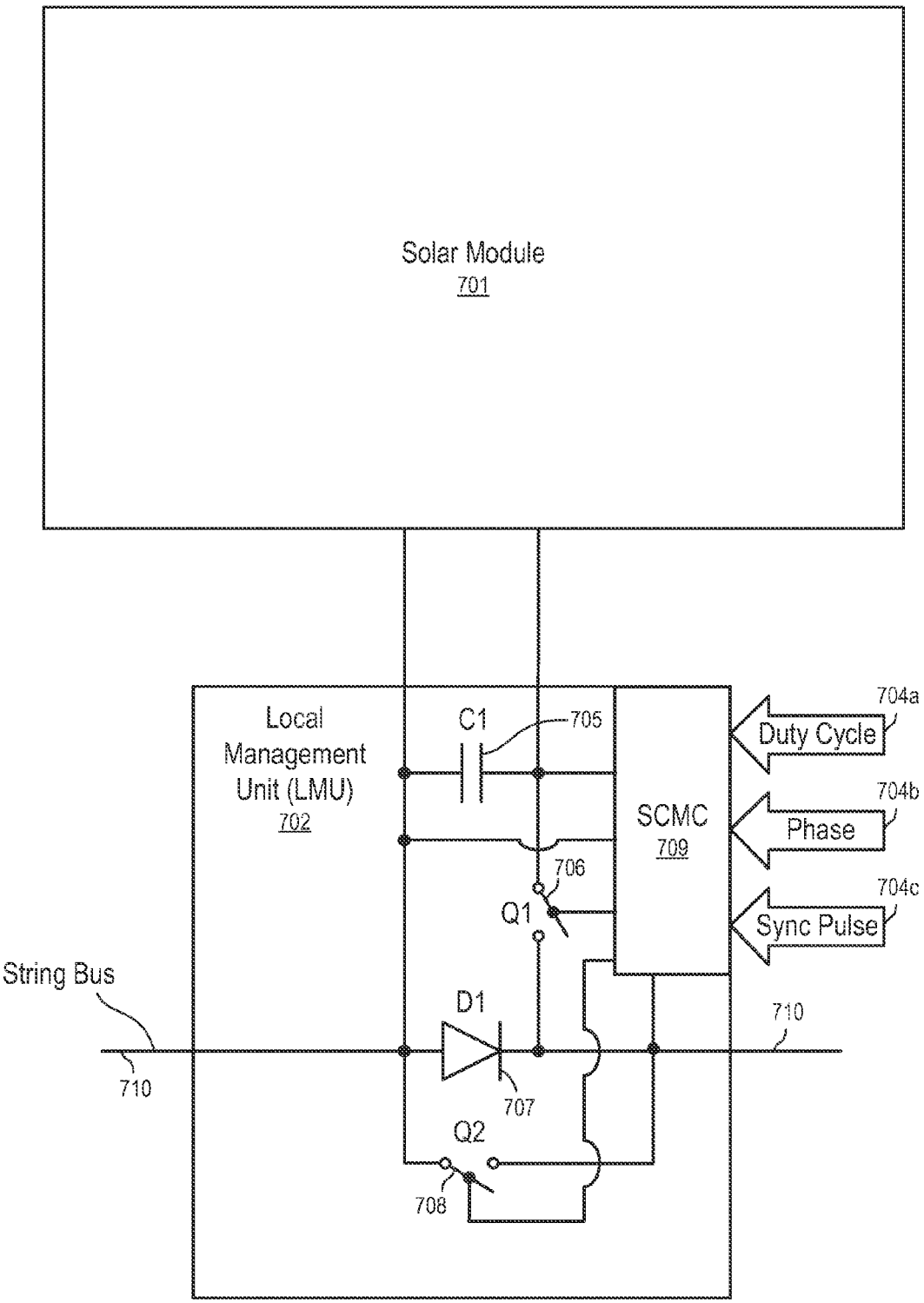
FIG. 7 illustrates a portion of another embodiment of an energy storage unit comprising a solar module, a local management unit, and a portion of a string bus.

FIGS. 6-7, illustrate LMU's according to some embodiments. In FIGS. 6-7, LMU's 602 may be configured to switch on and off the solar module 601 periodically to limit the voltage provided to the string bus 610 from each solar module 601. One example of a LMU 602 is any of the various LMU's (solar module controllers) offered by Tigo Energy, Inc. of Los Gatos, Calif.

FIG. 6 illustrates a portion of an embodiment of an energy storage unit comprising a solar module, a LMU, and a portion of a string bus. In FIG. 6, a LMU 602 is local to the solar module 601 and can be used to periodically couple the solar module 601 to the string bus 610 via the switch Q1 606. By periodically switching switch Q1 606, the voltage provided to the string bus 610 can be limited. The string bus 610 may or may not be part of an overall mesh configuration of solar modules 601.

The switch Q1 606 can be switched at a particular duty cycle. For the purposes of this disclosure, a "duty cycle" is the amount of time that a switch is closed (i.e., passing current). For instance, a duty cycle of 25% provides about a quarter of the solar module's 601 voltage to the string bus 610 since, and assuming a one second period, the switch is closed for 0.25 seconds and open for 0.75 seconds. As another example, a 100% duty cycle provides about 100% of the solar module's 601 voltage to the string bus 610 since the switch is continuously closed and connecting a solar module to the string bus 610.

The LMU 602 may include a local controller 609 to control connectivity to the string bus 603. In an embodiment, the local controller 609 controls connectivity to the string bus 603 via the switch Q1 606. Such control may be based on parameters such as duty cycle 604a, phase 604b, and synchronization pulse 604c. In one embodiment, the command to control the operation of the switch Q1 606 is sent to the LMU 602 over the photovoltaic (PV) string bus (power line) 610. Alternatively, separate network connections can be used to transmit the data and/or commands to/from the LMU 602. Wireless communications are also possible.

The switch Q1 606 duty cycle can be adjusted by the LMU 602 based on measurements taken by the LMU 602. Alternatively, the duty cycle can be adjusted by the LMU 602 based on measurements taken by one or more other LMU's or by a controller 150 (as in FIG. 1a). The LMU 602 is an example of a switchable connection.

It should be understood that the details of the LMU 602 can be implemented in the LMU's of FIGS. 1-3. For instance, in an embodiment combining FIG. 2 and FIG. 6, the controller 250 monitors the duty cycles of the LMU's 202(1), 202(2), 202(3), . . . , 202(n) and communicates data and/or signals representing the duty cycles to the LMU's 202(1), 202(2), 202(3), . . . , 202(n). Alternatively, the LMU's 202(1), 202(2), 202(3), . . . , 202(n) can communicate duty cycles to each other and determine their duty cycles based on those of the other LMU's. Alternatively, the LMU's 202(1), 202(2), 202(3), . . . , 202(n) can communicate duty cycles to a single LMU acting as the controller. That single LMU can then determine appropriate duty cycles for each LMU and communicate instructions for the other LMU's to operate at the determined duty cycles.

The LMU 602 may receive inputs 604a, 604b, 604c, which are illustrated separately. However, the inputs 604a, 604b, 604c are not necessarily communicated to the LMU 602 via separate connections. In one embodiment the inputs 604a, 604b, 604c may be received in the LMU via a single wired connection. In one embodiment, the inputs 604a, 604b, 604c are received in the LMU 602 via the string bus 610.

In one embodiment, the local controller 609 receives the parameters 604a, 604b, 604c from another LMU via the string bus 610 or a separate data communication connection (e.g., a separate data bus or a wireless connection, to name a few). In an embodiment, the local controller 609 receives the parameters 604a, 604b, 604c from a controller such as that depicted in FIG. 1a. In some embodiments, the local controller 609 may determine a parameter (e.g., 604a and 604b) based on the operating parameters of the solar module 601 and/or measurements obtained by the local controller 609 without communicating with other LMU's or a controller.

The LMU 602 may include a capacitor C1 605 to assist in filtering and/or ensuring that the voltage provided to the string bus 610 is relatively constant. As illustrated in FIG. 6, the solar module 601 is connected in parallel to the capacitor C1 605.

The LMU 602 may include a diode D1 607 to prevent current from traveling backwards in the string bus, for example in the case of a failure of the panel connected to said LMU. As illustrated in FIG. 6, the diode D1 607 is connected in series with the string bus 610. The switch Q1 606 of the LMU 602 can selectively connect or disconnect the solar module 601 and the capacitor C1 605 from a parallel connection with the diode D1 607. In so doing, the switch Q1 606 connects or disconnects the solar module 601 from the string bus 610. When the switch Q1 606 is on (closed), the solar module 601 provides energy to the string bus 610 and is supported by the capacitor C1 605 allowing a current larger than the current that could be provided solely by the solar panel. When the switch Q1 606 is off (open), the solar module 601 does not provide energy to the string bus 610 but rather the solar module 601 charges the capacitor C1 605 so it can discharge a portion of its energy during the next cycle. In other words, the capacitor C1 605 acts to smooth the voltage output which would otherwise have a square wave profile. In some cases, an active switch may be added in parallel to diode D1 607 to further enhance its efficiency (not illustrated) Additional filters may be may be used outside the diode D1 607 to reduce noise in the string (e.g., capacitors, resistors, inductors, or any combination of these, to name a few).

FIG. 7 illustrates a portion of another embodiment of an energy storage unit comprising a solar module, a LMU, and a portion of a string bus. The LMU 702 is connected between the solar module 701 and the string bus 710 to control or limit the voltage provided to the string bus 710. Commands to the LMU 702 can be sent over the photovoltaic (PV) string bus (power line) 710. The inputs 704a, 704b, 704c to the local controller 709 were drawn separately, which does not necessarily indicate that the inputs 704a, 704b, 704c are provided via separate connections and/or from outside the LMU 702. For example, in some embodiments, the local controller 709 may determine the parameters 704a, 704b, 704c based on measurements obtained at the LMU 702, with or without data from outside the LMU 702.

FIG. 7, like FIG. 6, includes a LMU 702 coupling the solar module 701 to the string bus 710. The LMU 702 periodically connects and disconnects the solar module 701 to and from the string bus 710. The LMU 702 is parallel coupled to the solar module 701 and series connected to the string bus 710. The LMU 702 can be serially connected to other LMU's. The LMU 702 has a switchable connection (e.g., switch Q1 706) configured to connect and disconnect the solar module 701 to the string bus 710. The LMU 702 may receive, among others, three inputs or types of input data, including the following: (a) requested duty cycle 704a, which can be expressed as a percentage (e.g., from 0 to 100%) of time the solar module 701 is to be connected to the string bus 710 via the switch Q1 706, (b) a phase shift 704b in degrees (e.g., from 0 degree to 180 degree) and (c) a timing or synchronization pulse 704c. These inputs (e.g., 704a, 704b and 704c) can be supplied as discrete signals, or can be supplied as data on a network, or composite signals sent through the power lines (e.g., string bus 710) or wirelessly, and in yet other cases, as a combination of any of these input types.

In FIG. 7, the LMU 702 includes a capacitor C1 705 and the switch Q1 706, as well as a diode D1 707. In FIG. 7, the diode D1 707 is supplemented with an additional switch Q2 708, which acts as a synchronous rectifier to increase efficiency. In one embodiment, the additional switch Q2 708 is open (off) when the switch Q1 706 is closed (on) to connect the solar module 701 (and the capacitor C1 705) to the string bus 710. When the switch Q1 706 is open (off), and the solar module 701 is charging the capacitor C1 705, the additional switch Q2 708 can be closed (on) to divert the current on the string bus 710 around the diode D1 707. In this fashion, losses from passing current through the forward-biased diode D1 707 can be avoided.

In some cases, a filter (not shown), including a serial coil and a parallel capacitor, can be used. The filter may be placed at the LMU or placed just before the fuse box or inverter, or be part of either one of those.

In FIG. 7, the controller 709 is used to process the input signals (e.g., 704a, 704b, 704c) and drive the switches Q1 706 and Q2 708. In the illustrated embodiment, the controller 709 is a small single chip micro controller (SCMC). For example, the controller 709 may be implemented using Application-Specific Integrated Circuit (ASIC) or Field-Programmable Gate Array (FPGA). The controller 709 can even be implemented in discrete, functionally equivalent circuitry, or in other cases a combination of SCMC and discrete circuitry. It will be generally referred to as single chip micro controller (SCMC) herein, but any implementation may be used.

In one embodiment, the local controller 709 is coupled to the solar module 701 in parallel to obtain power for processing; and the controller 709 is coupled to the string bus 710 to obtain signals transmitted from other LMU's coupled to the string bus 710, and to monitor currents and voltages on the string bus 710.

In one embodiment, the switches in different LMU's can operate at different phases to minimize voltage variance on the string bus. For example given two LMU's operating at a 50% duty cycle, the local controller of each LMU could be cycled 180 degrees (one half cycle) out of phase. As such, when one local controller opened the connection to its solar module, the other local controller closed the connection to its solar module. The result is a steadier supply of voltages to the string bus than if the two solar modules were connected and disconnected to the string bus at the same times.

In one embodiment, the local controller (SCMC) 709 is connected (not shown in FIG. 7) to the solar module 701 to obtain power for controlling the switches Q1 706 and Q2 708. In one embodiment, the local controller (SCMC) 709 is further connected (not shown in FIG. 7) to the string bus 710 to transmit and/or receive information from the string bus 710. In one embodiment, the local controller (SCMC) 709 includes sensors (not shown in FIG. 7) to measure operating parameters of the solar module 701, such as module voltage, module current, temperature, light intensity, etc.

Returning now to the controller described throughout this disclosure, various means for determining when and how to limit the voltages provided to the string bus are possible. For instance, an energy production system may comprise a string bus, a solar module connected to the string bus and generating a voltage, and a controller in communication with the solar module and the string bus. The controller may be configured to control what portion of the voltage is provided to the string bus based on a predicted future voltage. For the purposes of this disclosure, a "predicted future voltage" is an estimated voltage existing at a particular future time. For instance, the controller may monitor the string bus and note that the string bus voltage is likely to exceed a regulatory limit within five minutes. The expected voltage in five minutes is called the predicted future voltage. As a result, the controller may limit the voltage contribution of one or more solar modules to the string bus so that the string bus voltage remains below the regulatory limit, in some cases preferably in a balanced manner.

In an embodiment, the portion of a solar module's voltage provided to the string bus may be roughly inversely related to the magnitude of the predicted future voltage. In other words, the greater the predicted future voltage, the lower the voltage provided to the string bus.

The predicted future voltage can also be determined via a voltage trend. A voltage trend may include data or analysis of data regarding voltages that have been monitored. This historical data or trend data can be used to estimate what the predicted future voltage will be.

In an embodiment, the voltage provided to the string bus may be limited to a default voltage. In other words, when the string bus voltage or some other monitored voltage becomes excessive or is predicted to become excessive, the voltage provided to the string bus from one or more solar modules can be limited to a predefined default value. For instance, when the string bus voltage approaches a regulatory limit, the voltage from each solar module provided to the string bus can be limited to 50% of each solar module's maximum output. Alternatively, when the string bus voltage or some other monitored voltage becomes excessive or is predicted to become excessive, one or just a few solar modules can be limited to contributing 50% of their output voltage to the string bus. In an embodiment, a voltage threshold may be used to determine when one or more solar modules should be limited to providing a default voltage to the string bus. For instance, given a voltage threshold of 590V on the string bus, and due to a malfunction in the inverter, the string bus voltage exceeds 590V, the voltages that each solar module provides to the string bus may be limited to a default value (e.g., 75% of output or 50% of output or 25% of output, to name a few). In an embodiment, turning to the default voltage can be triggered by a hardware (e.g., differential amplifier and a Zener diode threshold) or software safety mechanism. As an example, if the controller monitors a certain rate of change it may trigger commands to the LMU's to fall back to the default voltage. These and similar methods allow the system, in extraordinary situations (e.g., loss of load or partial loss of wiring) to maintain string bus voltage below regulatory or safety limits.

In an embodiment, the controller can communicate with any other part of the energy production system via one or more of the LMU's. In an embodiment, the controller can monitor voltages on the string bus via a LMU. For instance, the controller can monitor voltage on the string bus via data gathered by each of the LMU's.

Figure 8:
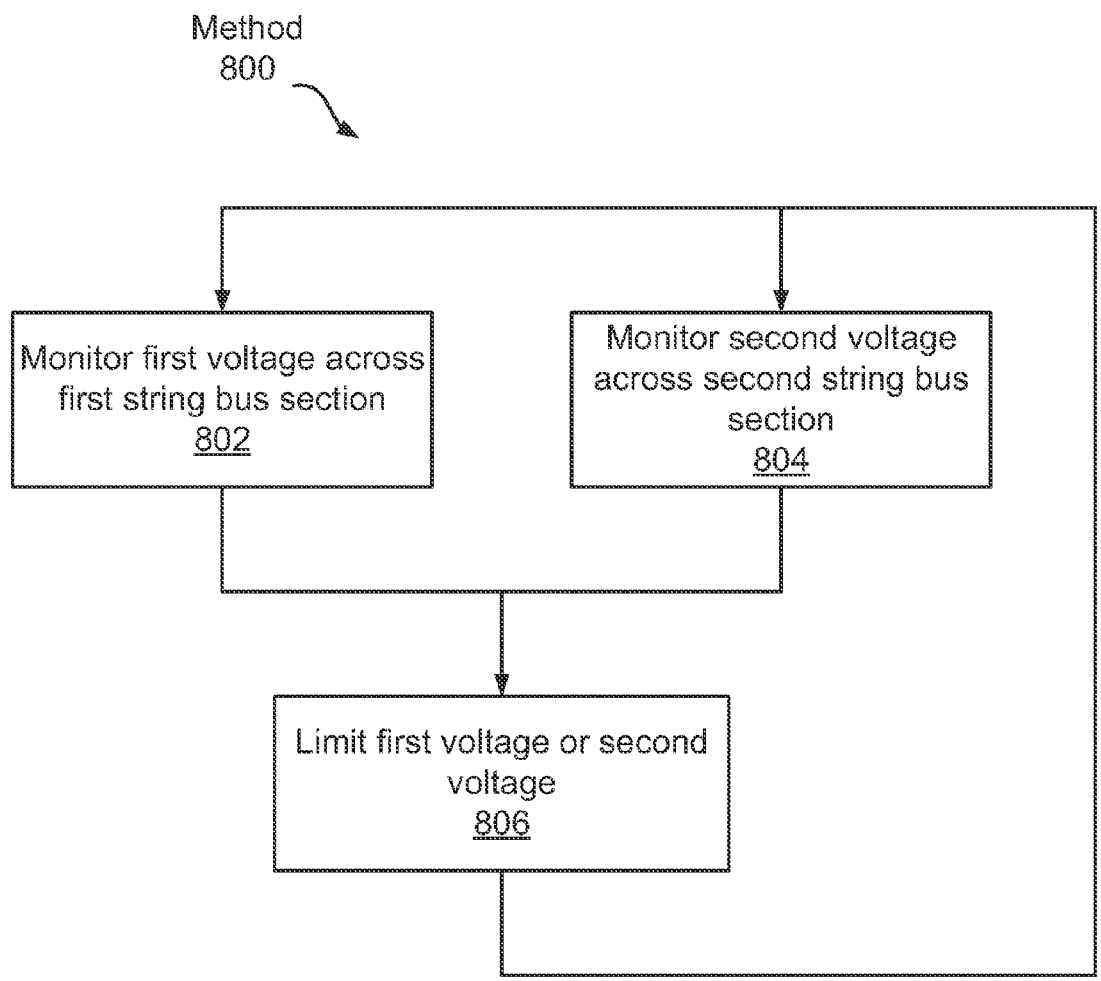
FIG. 8 illustrates a method for carrying out the functions of the systems herein disclosed.

FIG. 8 illustrates a method for carrying out the functions of the systems herein disclosed. The method 800 includes a monitor first voltage operation 802 in which a first voltage is monitored across a first string bus section. The first string bus section includes a portion of the string bus connecting a first solar module to a second solar module. The first voltage will thus include the voltage provided to the string bus by the first solar module plus any voltage already contributed to the string bus via upstream solar modules (downstream being the direction that current travels).

The method 800 also includes a monitor second voltage operation 804 in which a second voltage is monitored across a second string bus section. The second string bus section includes a portion of the string bus connecting a second solar module to a downstream solar module or an output voltage. As noted in FIG. 1a, the output voltage can be connected to any number of devices or systems including a string combiner, an inverter, a power grid, or power lines, to name a few. The second voltage will thus include the voltage provided to the string bus by the second solar module plus the voltage provided by the first solar module plus any voltage already contributed to the string bus via upstream solar modules.

In an embodiment, the first and second monitor voltage operations 802, 804 can operate simultaneously. In an embodiment, one of the two operations 802, 804 can follow the other in time. In an embodiment, the first and second monitor voltage operations 802, 804 may operate over different periods of time while a portion of those periods of time may overlap.

Figure 9:
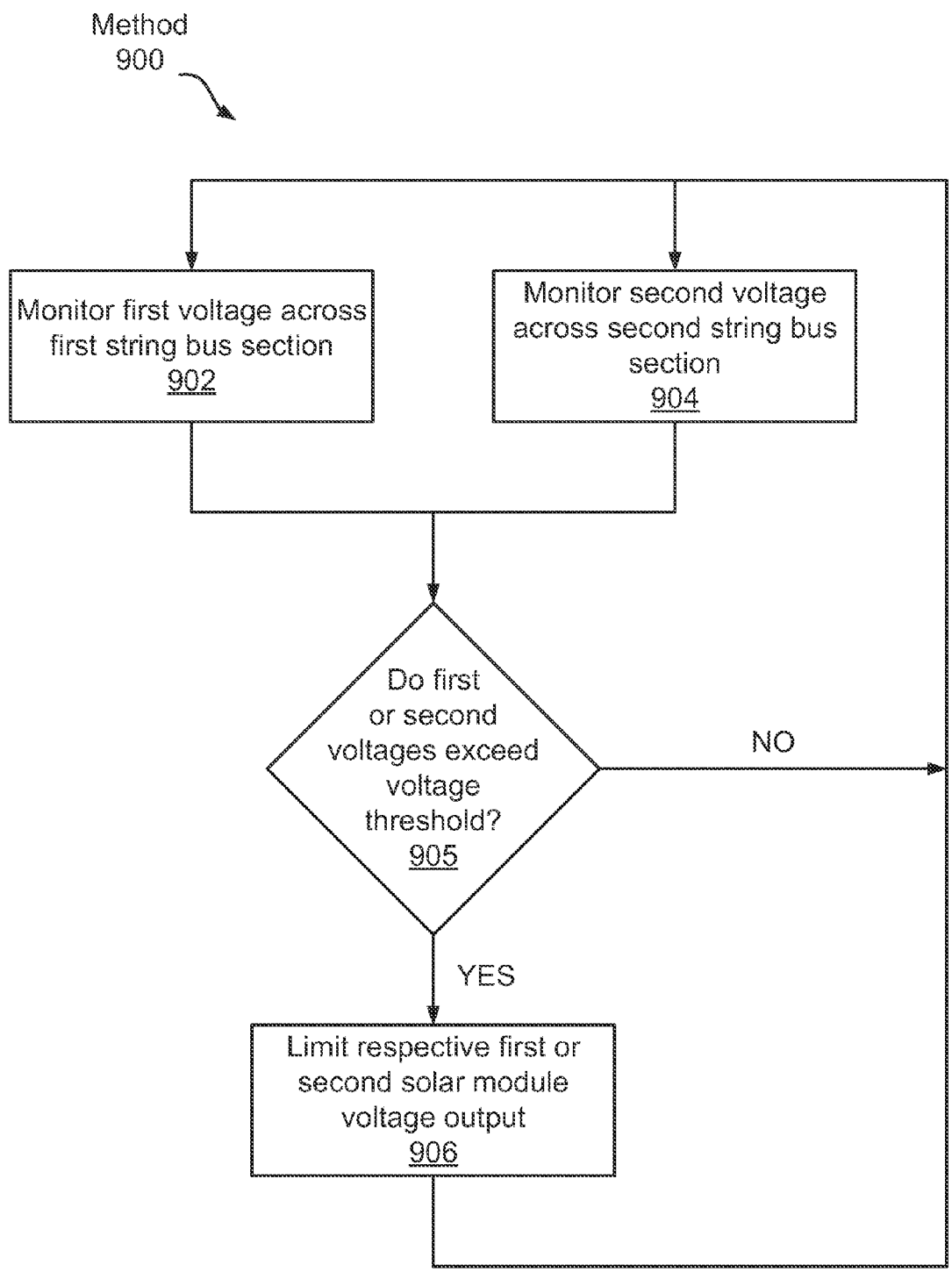
FIG. 9 illustrates another method for carrying out the functions of the systems herein disclosed.
Figure 10:
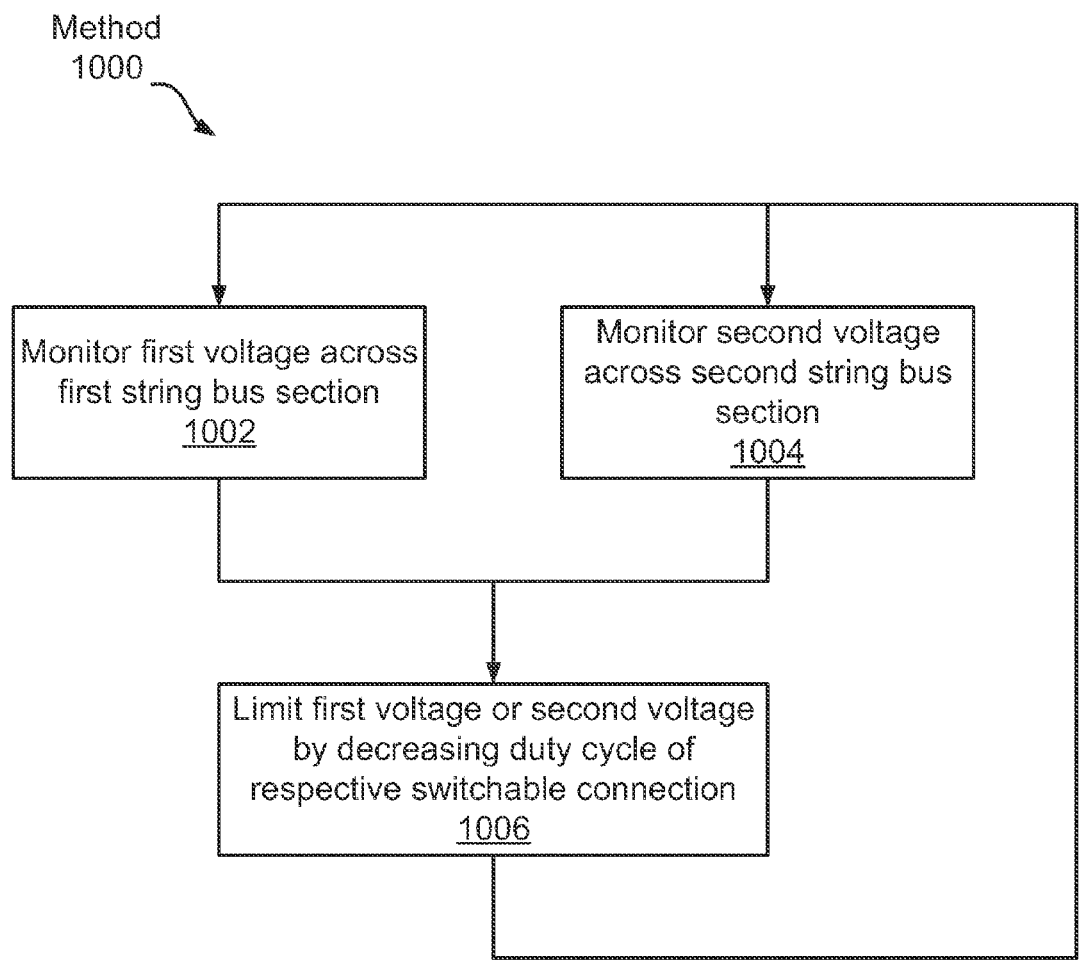
FIG. 10 illustrates another method for carrying out the functions of the systems herein disclosed.

The method 800 also includes a limit first voltage or second voltage operation 806. In an embodiment, the limit operation 806 may limit the first voltage by limiting the voltage output of the first solar module. With reference to FIGS. 8-10, voltage is measured on the string bus, while voltage output is the voltage provided to the string bus from a solar module. In an embodiment, the limit operation 806 may limit the second voltage by limiting the voltage output of the second solar module. In an embodiment, the limit operation 806 may limit the first and second voltages, to the same or different values, by limiting the voltage output of the first and second solar modules. Limiting voltage output can be performed via any of the systems and methods described previously or with reference to FIGS. 1-7. Determining when and by how much voltage will be limited can also be performed via any of the systems and methods previously described or with reference to FIGS. 1-7.

Although only two solar modules have been described with reference to FIG. 8, it should be understood that the disclosed method applies to any number of solar modules. It should also be understood that the monitoring operations 802, 804 and the limiting operation 806 do not have to operate sequentially. In an embodiment, the limiting operation 806 can be carried out while monitoring continues. In other words, monitoring can be a continuous process or discrete (currents and voltages monitored at periodic intervals).

FIG. 9 illustrates another method for carrying out the functions of the systems herein disclosed. The method 900 includes a monitor first voltage operation 902 in which a first voltage is monitored across a first string bus section. The first string bus section includes a portion of the string bus connecting a first solar module to a second solar module. The first voltage will thus include the voltage provided to the string bus by the first solar module plus any voltage already contributed to the string bus via upstream solar modules (downstream being the direction that current travels).

The method 900 also includes a monitor second voltage operation 904 in which a second voltage is monitored across a second string bus section. The second string bus section includes a portion of the string bus connecting a second solar module to a downstream solar module or an output voltage. As noted in FIG. 1a, the output voltage can be connected to any number of devices or systems including a string combiner, an inverter, a power grid, or power lines, to name a few. The second voltage will thus include the voltage provided to the string bus by the second solar module plus the voltage provided by the first solar module plus any voltage already contributed to the string bus via upstream solar modules.

In an embodiment, the first and second monitor voltage operations 902, 904 can operate simultaneously. In an embodiment, one of the two operations 902, 904 can follow the other in time. In an embodiment, the first and second monitor voltage operations 902, 904 may operate over different periods of time while a portion of those periods of time may overlap.

Once the first and second voltages have been monitored, the method 900 compares the first and second voltages to a threshold voltage via a determination operation 905. The determination operation 905 determines whether the first or second voltages exceed the voltage threshold. Such comparison can be performed, for instance, as a backup safety measure. Normally, the system predicts future voltages, and can scale back voltage output from solar modules in order to account for unusually high solar module voltage generation. However, sometimes string bus voltage may rise faster than the system can react to. In such an instance the determination operation 905 can lead to initiation of an automatic voltage limitation—a backup safety measure. One or more of the solar modules can automatically be instructed to limit output voltage to a specified low level when the voltage threshold is exceeded. Thus, by setting the voltage threshold at a level below a regulatory or safety limit, the method 900 ensures that solar module voltage outputs will be quickly and significantly reduced if the string bus voltage gets too close to a safety or regulatory limit. In an embodiment, the threshold voltage may be different for each section of the string bus.

In an embodiment, when either the first or second voltages exceed the voltage threshold, the voltage output of the first or second solar module (or both), whichever is generating excessive voltage, can be limited. In an embodiment, when either the first or second voltages (or both) exceed the voltage threshold, the voltage output of the first and second solar modules can be limited. Such, an embodiment might be used where greater safety is desired than in the embodiment where only select solar module output voltages are limited.

If the voltage threshold is exceeded, then one or both of the solar modules can be regulated. As such, the method 900 includes a limit first voltage and second voltage operation 906. In an embodiment, the limit operation 906 may limit the first voltage by limiting the voltage output of the first solar module. In an embodiment, the limit operation 906 may limit the second voltage by limiting the voltage output of the second solar module. In an embodiment, the limit operation 906 may limit the first and second voltages by limiting the voltage output of the first and second solar modules. Limiting voltage output can be performed via any of the methods and systems described in earlier paragraphs and with reference to FIGS. 1-7.

If the voltage threshold is not exceeded, then the method 900 can loop back to the monitor operations 902, 904. The monitor operations 902, 904 can reinitiate after the determination operation 905, can automatically operate at a periodic interval, or can continuously monitor voltages. Although only two solar modules have been described with reference to FIG. 9, it should be understood that the disclosed method applies to any number of solar modules.

FIG. 10 illustrates another method for carrying out the functions of the systems herein disclosed. In the method 1000, the duty cycle of all LMU's (or their switchable connections, should they have them) can be adjusted in order to limit or regulate the string bus voltage. The duty cycles may be adjusted so that the voltage provided to the string bus do not cause the string bus voltage to exceed the maximum voltage allowed (e.g., regulatory or safety limits, to name two). For example, the maximum voltage may be limited by the string combiner 130, the inverter 140, or any other load connected to the string bus 110, or limited by any regulations applicable to that system. In some embodiments, the duty cycles are adjusted to align the voltage of multiple strings.

To limit string bus voltage, the method 1000 includes a monitor first voltage operation 1002 and a monitor second voltage operation 1004. The method 1000 also includes a limit first or second voltages operation 1006. The limit operation 1006 limits the voltage output from either the first or second solar modules depending on which one (or both) is generating a voltage that is or may cause the string bus voltage to exceed the maximum allowable voltage. This is done via adjusting the duty cycle of switchable connections coupling the solar modules to the string bus. There is at least one switchable connection between each solar module and the string bus.

In one embodiment, the duty cycles are computed for the solar modules that are connected to a string bus via corresponding LMU's. The duty cycles can be calculated based on measured current and voltages of the solar modules.

After an initial set of duty cycles is applied to the solar modules, the duty cycles can be further fine tuned and/or re-adjusted to changes in current and/or voltage. In one embodiment, target voltages are computed for the solar modules, and the duty cycles are adjusted so that the voltages provided to the string bus converge towards the target voltages. The methods to compute the duty cycles of the solar modules can also be used to compute the duty cycles of the groups of solar cells within a solar module (recall FIG. 5).

Many variations may be applied to the systems and methods herein disclosed without departing from the spirit of the invention. For example, additional components may be added, or components may be replaced. For example, rather than using a capacitor as to smooth solar module voltage output, an inductor may be used, or a combination of inductor(s) and capacitor(s). Also, the controller and/or LMU's can comprise hardware, hardware and software, or software. Additionally, the controller can be further connected to a private network (e.g., intranet) or the Internet. The controller could then communicate with other computers and servers. One application of such a connection would allow the controller to determine the local regulatory voltage limits and modify voltage thresholds and voltage limiting algorithms accordingly to tailor the system to those local regulatory voltage limits. Also, the balance between hardware and firmware in the controllers or LMU's can be changed without departing from the spirit of the invention. In case the controller or LMU's are not able to communicate with each other (e.g., during startup), the controller or LMU's may have a default voltage limit at which they operate until communications can be established. The methods for determining the duty cycles for the solar modules can also be used to determine the duty cycles of groups of cells connected via LMU's in a string of solar cells within a solar module.

In one embodiment, the controller can be off the shelf and possibly modified. In one embodiment, the controller can have analog circuitry. In one embodiment, the controller can be a microcontroller. In one embodiment, the controller could be a combination of these features.

It is clear that many modifications and variations of this embodiment may be made by one skilled in the art without departing from the spirit of the novel art of this disclosure. These modifications and variations do not depart from the broader spirit and scope of the invention, and the examples cited here are to be regarded in an illustrative rather than a restrictive sense.

In the foregoing specification, the disclosure has been described with reference to specific exemplary embodiments. Various modifications may be made thereto without departing from the broader spirit and scope of the disclosure. The specification and drawings are illustrative rather than restrictive.

The invention claimed is:

1. An energy production system, comprising:
a string bus;
a first solar module connected to the string bus and generating a first voltage;
a second solar module connected to the string bus and generating a second voltage; and
a controller, communicatively coupled to the first solar module and the second solar module, configured to control at least one of the first and second voltages provided to the string bus based at least in part on a maximum regulatory safety voltage.

2. The energy production system of claim 1, further comprising:
a first local management unit coupled between the first solar module and the string bus, and in communication with the single controller; and
a second local management unit coupled between the second solar module and the string bus, and in communication with the single controller.

3. The energy production system of claim 2, wherein the controller controls the first local management unit and the second local management unit.

4. The energy production system of claim 1, wherein the controller comprises:
a first local management unit coupled between the first solar module and the string bus; and
a second local management unit coupled between the second solar module and the string bus.

5. The energy production system of claim 1, further comprising a switchable connection between:
the first solar module and the string bus; and
the second solar module and the string bus.

6. The energy production system of claim 5, wherein the switchable connection includes at least one transistor.

7. The energy production system of claim 6, wherein:
the first voltage provided to the string bus is controlled via a duty cycle parameter and a phase parameter applied to the at least one transistor of the first local management unit; and
the second voltage provided to the string bus is controlled via a duty cycle of the at least one transistor of the second local management unit.

8. The energy production system of claim 1, wherein the controller prevents a voltage on the string bus from exceeding a predefined limit.

9. An energy production system, comprising:
a string bus;
a solar module connected to the string bus and generating a voltage; and
a controller in communication with the solar module and the string bus, and configured to control the voltage provided to the string bus based at least in part on a maximum regulatory safety voltage.

10. The energy production system of claim 9, wherein a connection between the solar module and the string bus can be disconnected via a switch.

11. The energy production system of claim 10, wherein the controller adjusts the duty cycle of the switch.

12. The energy production system of claim 10, wherein the switch is a transistor.

13. The energy production system of claim 9, wherein the controller is further configured to control the voltage provided to the string bus based on a predicted future voltage based on a voltage trend.

14. The energy production system of claim 9, wherein the controller is further configured to limit the voltage provided to the string bus to a default voltage.

15. The energy production system of claim 14, wherein the default voltage is used when the voltage exceeds a voltage threshold.

16. The energy production system of claim 9, wherein the solar module is connected to the string bus via a local management unit.

17. A method comprising:
- monitoring a voltage across a string bus section connecting a solar module to a voltage output; and
- limiting the voltage output based on a maximum regulatory safety voltage by limiting a voltage of the solar module.

18. The method of claim 17, wherein limiting comprises limiting the voltage of the solar module when the voltage of the solar module exceeds a voltage threshold.

19. The method of claim 17, wherein the limiting comprises controlling the voltage by controlling the duty cycle of a switchable connection coupled between the solar module and a string bus, and wherein the limiting comprises controlling a second voltage by controlling the duty cycle of a second switchable connection coupled between the second solar module and the string bus.

20. The method of claim 17, wherein the limiting is based on a predicted future voltage.

* * * * *